(12) United States Patent
Kizler et al.

(10) Patent No.: US 10,386,417 B2
(45) Date of Patent: Aug. 20, 2019

(54) ELECTRONIC BATTERY SENSOR AND METHOD FOR DETERMINING AN INTERNAL RESISTANCE OF A BATTERY

(71) Applicant: Robert Bosch GmbH, Stuttgart (DE)

(72) Inventors: Joachim Kizler, Bangalore (IN); Eberhard Schoch, Stuttgart-Feuerbach (DE); Juergen Motz, Steinheim an der Murr (DE); Martin Holger Koenigsmann, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 300 days.

(21) Appl. No.: 15/127,666

(22) PCT Filed: Feb. 20, 2015

(86) PCT No.: PCT/EP2015/053567
§ 371 (c)(1),
(2) Date: Sep. 20, 2016

(87) PCT Pub. No.: WO2015/144367
PCT Pub. Date: Oct. 1, 2015

(65) Prior Publication Data
US 2017/0131359 A1 May 11, 2017

(30) Foreign Application Priority Data
Mar. 25, 2014 (DE) .......................... 10 2014 205 495

(51) Int. Cl.
*G01R 31/36* (2019.01)
*G05F 3/00* (2006.01)
(Continued)

(52) U.S. Cl.
CPC ......... *G01R 31/367* (2019.01); *G01R 31/389* (2019.01); *G01R 31/3842* (2019.01)

(58) Field of Classification Search
CPC ............ G01R 31/3651; G01R 31/3624; G01R 31/3662
See application file for complete search history.

(56) References Cited

U.S. PATENT DOCUMENTS 5,140,269 A * 8/1992 Champlin ........ G01R 19/16542
324/433
5,680,050 A * 10/1997 Kawai .................. G01R 31/361
324/427
(Continued)

FOREIGN PATENT DOCUMENTS

| CN | 101010596 A | 8/2007 |
| CN | 101477149 A | 7/2009 |

(Continued)

OTHER PUBLICATIONS

International Search Report issued in PCT/EP2015/053567 dated Jun. 25, 2015.

*Primary Examiner* — Huy Q Phan
*Assistant Examiner* — Zannatul Ferdous
(74) *Attorney, Agent, or Firm* — Norton Rose Fulbright US LLP; Gerard Messina

(57) ABSTRACT

An electronic battery sensor and a method for determining an internal resistance of a battery, including at least one first detector for detecting measured values, and a battery model for ascertaining the internal resistance. Each measured value includes simultaneous information concerning at least two corresponding measured variables, in particular battery current and battery voltage, and every two successive measured values represents a measuring pair. The battery sensor includes at least one selector which is configured for selecting from a specified number of measuring pairs at least one measuring pair as a selection pair, and for providing the selection pair to the battery model in order to ascertain the
(Continued)

internal resistance, the number of measuring pairs being greater than the number of selection pairs.

12 Claims, 4 Drawing Sheets

(51) Int. Cl.
    *G01N 27/416*      (2006.01)
    *G01R 31/367*      (2019.01)
    *G01R 31/389*      (2019.01)
    *G01R 31/3842*      (2019.01)

(56) References Cited

U.S. PATENT DOCUMENTS

| | | | |
|---|---|---|---|
| 7,358,704 | B2 | 4/2008 | Yumoto et al. |
| 7,620,524 | B2 | 11/2009 | Frey et al. |
| 8,328,580 | B2 | 12/2012 | Mazingue-Desailly et al. |
| 8,872,481 | B2 | 10/2014 | Chawla et al. |
| 2001/0035738 | A1* | 11/2001 | Laig-Horstebrock ........ G01R 31/3828 320/132 |
| 2005/0194976 | A1 | 9/2005 | Yumoto et al. |
| 2005/0231218 | A1 | 10/2005 | Steinmill |
| 2007/0182385 | A1* | 8/2007 | Ueda ............... H02J 7/1438 323/211 |
| 2008/0281559 | A1 | 11/2008 | Frey et al. |
| 2009/0115419 | A1* | 5/2009 | Ueda ............ G01R 31/3624 324/430 |
| 2011/0301891 | A1 | 12/2011 | Kim |
| 2012/0164883 | A1 | 6/2012 | Mazingue-Desailly et al. |
| 2012/0303301 | A1* | 11/2012 | Park ............... G01R 31/3662 702/63 |
| 2012/0274285 | A1 | 12/2012 | Chawla et al. |
| 2015/0247778 | A1* | 9/2015 | Haschke ............ G01M 5/0083 73/801 |
| 2015/0303533 | A1* | 10/2015 | Osaka ............ G01R 31/3651 429/90 |

FOREIGN PATENT DOCUMENTS

| | | |
|---|---|---|
| CN | 101750587 A | 6/2010 |
| CN | 201532446 U | 7/2010 |
| CN | 103098278 A | 5/2013 |
| DE | 101 63 222 A1 | 7/2003 |
| DE | 10 2009 000 828 A1 | 8/2010 |
| DE | 10 2009 001 300 A1 | 9/2010 |
| DE | 10 2010 043 388 A1 | 12/2011 |
| JP | H08262070 A | 10/1996 |
| JP | H08262073 A | 10/1996 |
| JP | H0933622 A | 2/1997 |
| JP | 2006250905 A | 9/2006 |
| JP | 2008101927 A | 5/2008 |
| JP | 2010216997 A | 9/2010 |
| JP | 2011047820 A | 3/2011 |
| JP | 2011128010 A | 6/2011 |
| JP | 2012026771 A | 2/2012 |
| JP | 2013-044580 A | 3/2013 |
| JP | 2013246088 A | 12/2013 |
| WO | 2006/037694 A1 | 4/2006 |

\* cited by examiner

ELECTRONIC BATTERY SENSOR AND METHOD FOR DETERMINING AN INTERNAL RESISTANCE OF A BATTERY

BACKGROUND INFORMATION

The present invention is directed to an electronic battery sensor and a method for determining an internal resistance of a battery. A method for reconstructing an electrical signal is described in PCT Patent Application No. WO 2006/037694. In this method, an analog measuring signal is sampled at a high sampling rate with the aid of an analog-digital converter. The voltage and current intensity of a battery, for example, are used here as measuring signals, from which an internal resistance may be subsequently computed. The internal resistance is computed by dividing a voltage difference by a current intensity difference. In addition, prior to the sampling the measuring signal is generally low-pass filtered in order to adhere to the sampling theorem. The occurrence of aliasing may be avoided in this way. In the described method, the current signals and voltage signals necessary for computing the internal resistance are detected by a current sensor and a voltage sensor, respectively.

An object of the present invention is to allow a high sampling rate, and at the same time, to avoid a long computing time for computing the internal resistance.

SUMMARY

The present invention is directed to an electronic battery sensor, including at least one first detector for detecting measured values, and a battery model for ascertaining the internal resistance of a battery, each measured value including simultaneous information concerning at least two corresponding measured variables, in particular battery current and battery voltage, and every two successive measured values representing a measuring pair. The core of the present invention is that the battery sensor includes at least one selector which is configured for selecting from a specified number of measuring pairs at least one measuring pair as a selection pair, and for providing the selection pair to the battery model in order to ascertain the internal resistance, the number of measuring pairs being greater than the number of selection pairs. It is advantageous that sampling may thus still be carried out at a high sampling rate, but only a portion of these sampled measured values are relayed to the battery model. The computing time of the battery model is thus kept low, and due to the high sampling rate, high accuracy of the measurement is still ensured. It is thus possible to sample at a high frequency and to relay only a portion of these sampled measuring pairs to the battery model, as the result of which the resistance computation in the battery model may take place at a lower frequency. In addition, due to the high sampling frequency, small current and voltage fluctuations at the battery are recognized, which would not have been recognized at a lower sampling frequency. This has the advantage that it is possible to recognize not only excitations at the battery due to the engine start, which cause large current and voltage fluctuations, but also smaller excitations. This is advantageous in particular for hybrid and electric vehicles, which do not have a classical engine start.

One advantageous embodiment of the present invention provides that the ratio of a working frequency of the detector and/or of the selector to a processing frequency of the battery model corresponds to the ratio of the number of measuring pairs to the number of selection pairs. It is advantageous that the ratio of the working frequency to the processing frequency may be set by selecting a specified number of measuring pairs, from which the specified number of selection pairs is then selected.

According to another advantageous embodiment of the present invention, it is provided that the selector is configured for selecting each nth measuring pair of the selected number of measuring pairs as a selection pair. It is advantageous that this represents a very simple algorithm for selecting the selection pair. The computing time in the selector may thus be kept very low.

According to another advantageous embodiment of the present invention, it is provided that the selector is configured for selecting at least one measuring pair, in particular the measuring pair having the current gradient with the largest magnitude, as a selection pair as a function of the gradients of the measuring pairs. It is advantageous that very well suited measuring pairs are thus selected in order to obtain a very good result in the subsequent computation of the internal resistance by the battery model.

In another advantageous embodiment of the present invention, it is provided that the selector is configured for forming an average value of all measuring pairs of the specified number of measuring pairs, and selecting this average value as a selection pair. It is advantageous that individual measuring errors may be compensated for by forming the average value of the measuring pairs.

According to another advantageous embodiment of the present invention, it is provided that the battery sensor includes a band pass filter, the band pass filter having the measured values as input variables, and being configured for providing the output variables to the selector. It is advantageous that low-frequency interference signals, which are not to be used for computing the internal resistance, may also be filtered.

Another advantageous embodiment of the present invention provides that the battery sensor includes an adaptor which is configured for adapting the phases of the corresponding measured variables to one another. It is advantageous that incorrect measured values due to phase shifts may be avoided. The quality of the result of the computation of the internal resistance subsequently carried out may thus be improved.

DETAILED DESCRIPTION OF EXAMPLE EMBODIMENTS

Figure 1:
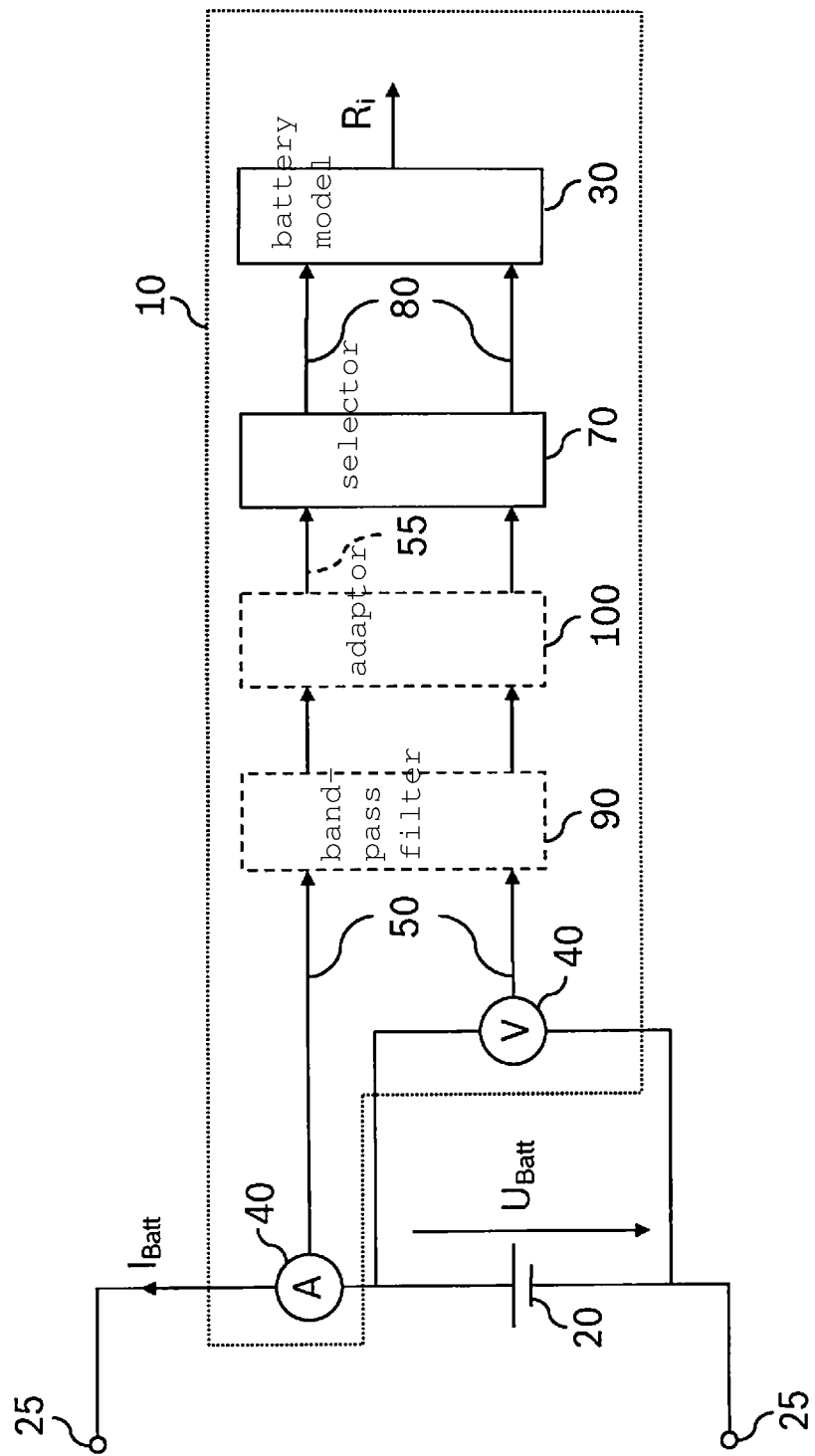
FIG. 1 shows a first exemplary embodiment of a battery sensor according to the present invention, which is connected to a battery.

FIG. 1 shows a first exemplary embodiment of a battery sensor according to the present invention. A battery 20 is illustrated. A battery voltage $U_{Batt}$ and a battery current $I_{Batt}$ are tappable at terminals 25. A battery sensor 10 is also illustrated. This battery sensor 10 includes two detectors 40 which detect battery voltage $U_{Batt}$ and battery current $I_{Batt}$. Detector 40 is connected to a selector 70, as the result of which measured values 50 or measuring pairs 60 are transmittable from detector 40 to selector 70. A band pass filter 90 is optionally situated between detector 40 and selector 70. An adaptor 100 is likewise optionally situated between detector 40 and selector 70. In addition, selector 70 is connected to a battery model 30. Selection pairs 80 may be provided to battery model 30 in this way. Based on selection pairs 80, battery model 30 may compute internal resistance $R_i$ and output it for further processing.

Battery 20 shown in FIG. 1 may be an automobile battery, for example, but may also be some other energy store. In addition, battery model 30 may be designed as an extended Kalman filter, for example.

Figure 2:
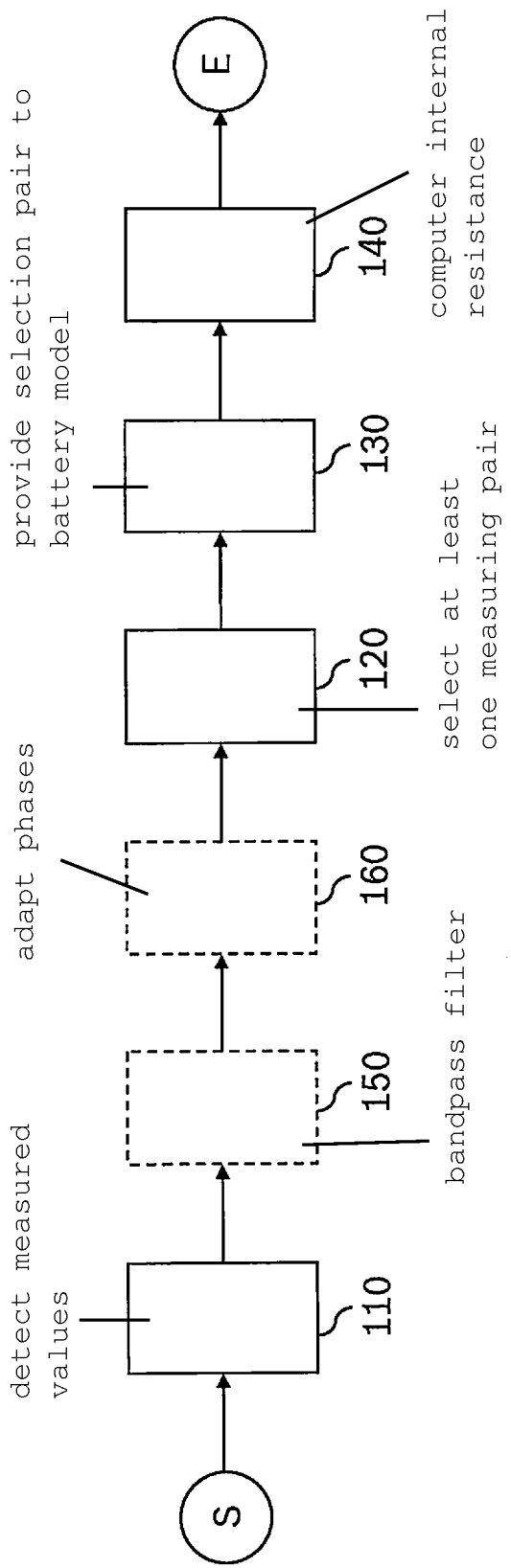
FIG. 2 shows a flow chart of the method according to the present invention for determining an internal resistance, in particular with the aid of a battery sensor according to FIG. 1.

FIG. 2 shows a flow chart of an operating method according to the present invention for determining the internal resistance of a battery, in particular with the aid of a battery sensor according to FIG. 1. The method begins at start S. Measured values 50 are subsequently detected in a first step 110. Each measured value 50 includes simultaneous information concerning at least two corresponding measured variables, for example battery current $I_{Batt}$ and battery voltage $U_{Batt}$. Two successive measured values 50 in each case represent a measuring pair 60. Detected measured values 50 or measuring pairs 60 are subsequently band-pass filtered in an optional step 150. Band pass filter 90 represents a combination of a high pass filter and a low pass filter. The low pass filter is used for filtering high-frequency components in order to adhere to the sampling theorem. In contrast, the high pass filter is used for filtering low-frequency interference signals, for example the pulse width modulation signal for controlling LEDs. The phases of the corresponding measured variables are adapted to one another in a further optional step 160. At least one measuring pair 60 is subsequently selected from a specified number of measuring pairs 60 as selection pair 80 in a step 120. Multiple alternatives are available for selecting selection pair 80. Thus, in a first alternative, each nth measuring pair 60 may be selected from a number of measuring pairs 60 as selection pair 80. In another alternative, measuring pair 60 having the largest current gradient is selected as selection pair 80. In yet another alternative, the average value of specified measuring pairs 60 is formed, and this average value is selected as selection pair 80. Selection pair 80 is then provided to battery model 30 for computing internal resistance $R_i$ in a subsequent step 130. Based on provided selection pair 80, internal resistance $R_i$ is subsequently computed by battery model 30 in a step 140. Lastly, the method ends at end E.

In the normal case, several of these methods according to FIG. 2 run in a time-delayed manner. Thus, for example, a number of specified measuring pairs 60 is detected, and these are further processed as shown; during the processing of these measuring pairs 60, new measuring pairs are already being detected and likewise further processed. In addition, a compression factor may be predefined by the ratio of the specified number of measuring pairs 60 to a number of selection pairs 80 selected therefrom. The detected quantity of measuring pairs 60 may thus be reduced by a targeted selection of measuring pairs 60 as selection pairs 80. Detection 110 of measured values 50 or measuring pairs 60, selection 120 of selection pairs 80, and optionally band-pass filtering 140 and phase adjustment 150 may thus take place at a high working frequency $f_x$. In contrast, the determination of internal resistance $R_i$ by battery model 30 may take place at a lower processing frequency $f_y$ due to a data volume reduced by the selection 120.

Figure 3:
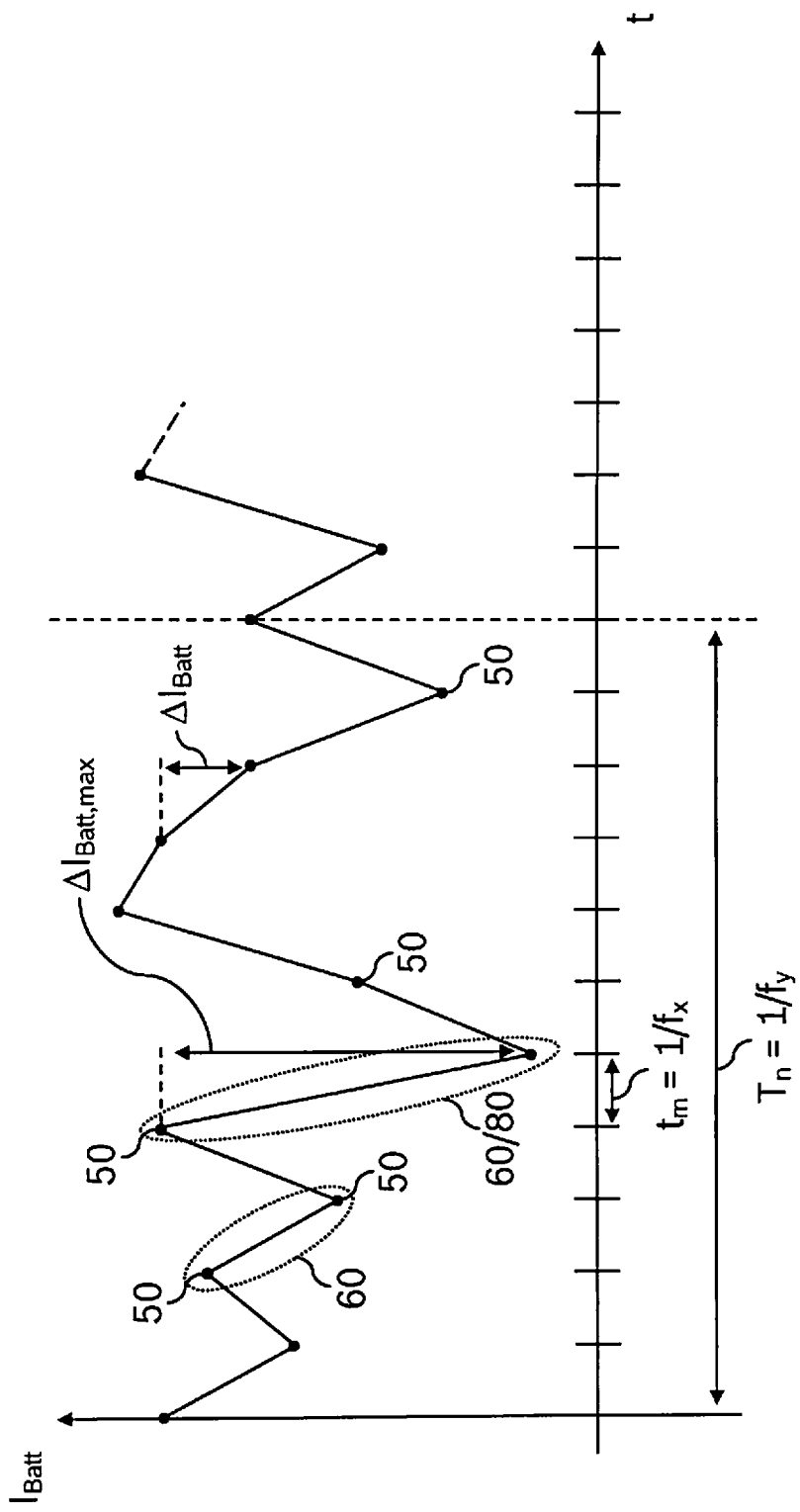
FIG. 3 shows a diagram in which the detected battery current is plotted with respect to time.

FIG. 3 shows a diagram in which the detected battery current is plotted with respect to time. Detected measured values 50 which are detected in each case within a time period $t_m$ at a continuous interval are illustrated. The reciprocal of time period $t_m$ represents working frequency $f_x$ of detector 40 and/or of selector 70. Optional band pass filter 90 and optional adaptor 100 likewise have this working frequency $f_x$. A measured value 50 in each case is made up of the value of battery current $I_{Batt}$ and the associated value of battery voltage $U_{Batt}$ at the same point in time; battery voltage $U_{Batt}$ is not graphically illustrated. Two successive measured values 50 in each case represent a measuring pair 60. In addition, the difference between two measured values 50 of a measuring pair 60 is referred to as a gradient. Thus, each measuring pair 60 has a current gradient $\Delta I_{Batt}$ and a voltage gradient $\Delta U_{Batt}$. Current gradient $\Delta I_{Batt}$ from an existing number of measuring pairs 60 which has the largest magnitude is referred to as maximum current gradient $\Delta I_{Batt,max}$. The same applies for voltage gradient $\Delta U_{Batt}$. For the selection condition for largest current gradient $\Delta I_{Batt,max}$ FIG. 3 illustrates selection pair 80 as selected measuring pair 60. If only one measuring pair 60 is selected as selection pair 80 from a specified number of measuring pairs 60, as shown in FIG. 3, the reciprocal of time period $T_n$, during which the specified number of measuring pairs 60 is detected, corresponds to processing frequency $f_y$ of battery model 30. In contrast, if multiple selection pairs are selected from the specified number of measuring pairs, the reciprocal of time period $T_n$ must still be multiplied by the number of selection pairs in order to determine processing frequency $f_y$.

Figure 4:
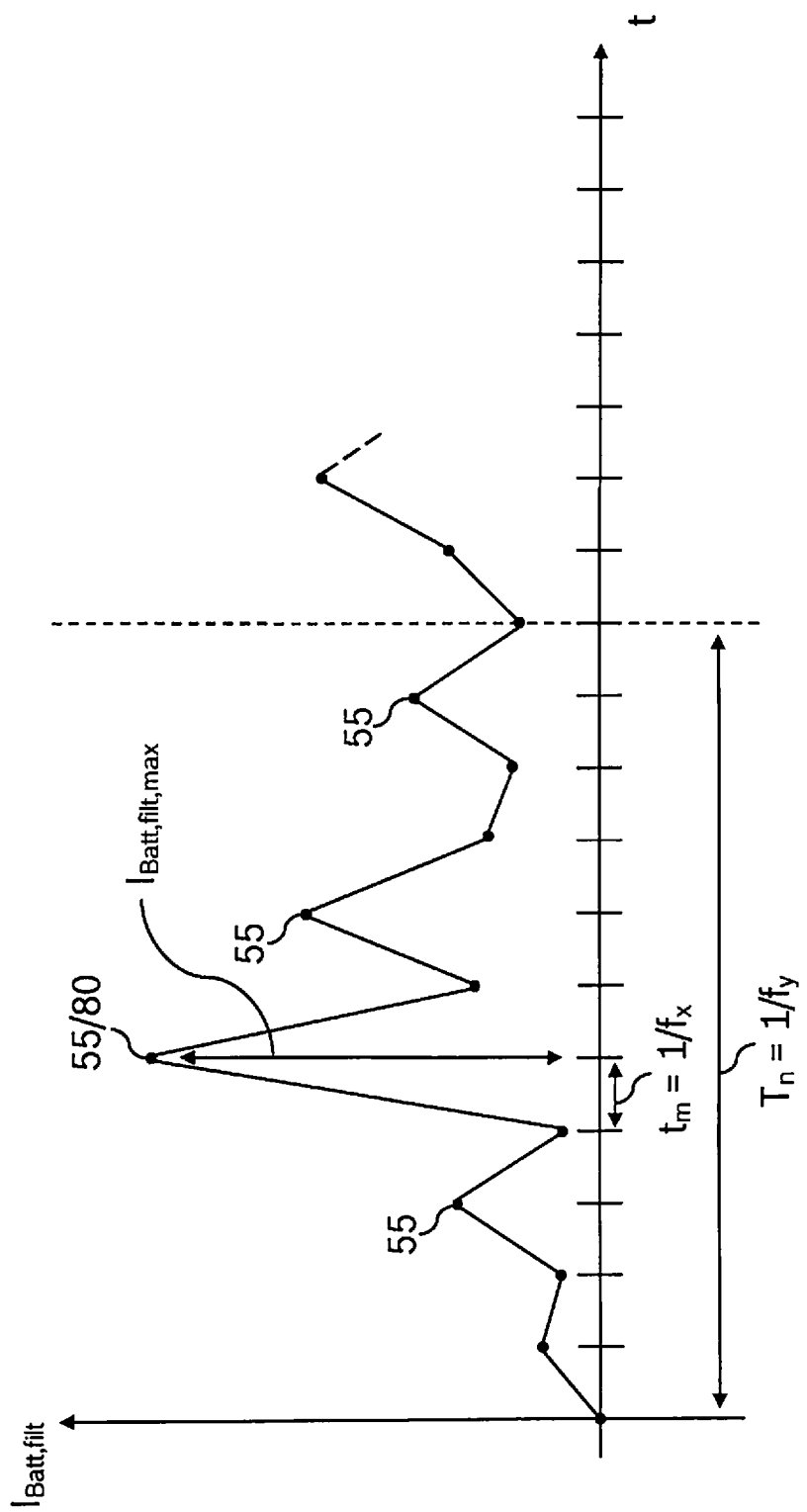
FIG. 4 shows a second diagram in which the detected battery current is plotted with respect to time.

FIG. 4 shows a second diagram in which the detected battery current is plotted with respect to time.

What is claimed is:

1. An electronic battery sensor, comprising:
   at least one first detector to detect measured values, each of the measured values including simultaneous information concerning at least two corresponding measured variables including battery current and battery voltage, every two successive measured values representing a measuring pair;
   a battery model for ascertaining an internal resistance of a battery;
   at least one selector configured for selecting at least one measuring pair from a specified number of measuring pairs as a selection pair, and providing the selection pair to the battery model to ascertain the internal resistance, wherein the number of measuring pairs is greater than the number of selection pairs, wherein:
   a ratio of a working frequency of at least one of the detector and the selector, to a processing frequency of the battery model corresponds to a ratio of the number of measuring pairs to the number of selection pairs.

2. The electronic battery sensor as recited in claim 1, wherein the selector is configured for selecting each nth measuring pair of the specified number of measuring pairs as a selection pair.

3. The electronic battery sensor as recited in claim 1, wherein the selector is configured to select at least one measuring pair, the measuring pair having a current gradient with the largest magnitude, as a selection pair as a function of the gradients of the measuring pairs.

4. The electronic battery sensor as recited in claim 1, wherein the selector is configured for forming an average value of all measuring pairs of the specified number of measuring pairs, and selecting the average value as a selection pair.

5. The electronic battery sensor as recited in claim 1, wherein the battery sensor includes a band pass filter, the band pass filter having the measured values as input variables, and being configured for providing output variables to the selector.

6. The electronic battery sensor as recited in claim 1, wherein the battery sensor includes an adaptor which is configured for adapting phases of the corresponding measured variables to one another.

7. A method for determining an internal resistance of an electronic battery sensor, comprising:
    detecting measured values by at least one first detector, each measured value including simultaneous information concerning at least two corresponding measured variables including battery current and battery voltage, and every two successive measured values representing a measuring pair;
    selecting by at least one selector, at least one measuring pair from a specified number of measuring pairs as a selection pair, the number of measuring pairs being greater than the number of selection pairs;
    providing the at least one selection pair in order to ascertain the internal resistance; and
    computing the internal resistance based on the gradients of the at least one selection pair, wherein:
    a ratio of a working frequency for at least one of detecting and selecting measuring pairs to a processing frequency for computing the internal resistance corresponds to a ratio of the number of measuring pairs to the number of selection pairs.

8. The method as recited in claim 7, wherein the specified number of measuring pairs is selected as a selection pair during the selection of each nth measuring pair.

9. The method as recited in claim 7, wherein during the selection, the gradients of the measuring pairs are compared to one another, and based on the comparison the measuring pair having a current gradient with the largest magnitude, is selected as a selection pair.

10. The method as recited in claim 7, wherein during the selection, an average value of all measuring pairs of the specified number of measuring pairs is formed, and the average value is selected as a selection pair.

11. The method as recited in claim 7, further comprising a further method step which takes place between the detection and the selection:
    band-pass filtering the detected measured values.

12. The method as recited in claim 7, further comprising a further method step which takes place between the detection and the selection:
    phase adjusting the corresponding measured variables.

* * * * *